(12) United States Patent
Fan

(10) Patent No.: US 11,574,968 B2
(45) Date of Patent: Feb. 7, 2023

(54) DISPLAY PANEL AND DISPLAY DEVICE

(71) Applicant: WuHan TianMa Micro-electronics CO.,LTD, Wuhan (CN)

(72) Inventor: Yanyun Fan, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 406 days.

(21) Appl. No.: 16/730,583

(22) Filed: Dec. 30, 2019

(65) Prior Publication Data
US 2021/0066409 A1  Mar. 4, 2021

(30) Foreign Application Priority Data

Aug. 27, 2019 (CN) .......................... 201910795530.2

(51) Int. Cl.
*G06F 1/16* (2006.01)
*H01L 27/32* (2006.01)

(52) U.S. Cl.
CPC ........ *H01L 27/3234* (2013.01); *G06F 1/1605* (2013.01); *H01L 27/326* (2013.01)

(58) Field of Classification Search
CPC ............ G09G 5/14; G09G 5/377; G09G 3/20; G09G 3/30; G09G 3/3208; G09G 3/3275; G09G 3/3225; G09G 3/3258; G09G 3/3291; G09G 3/3233; G09G 3/3216; H01L 51/00; H01L 51/50; H01L 51/52; H01L 51/56;
(Continued)

(56) References Cited

U.S. PATENT DOCUMENTS

2018/0219058 A1* 8/2018 Xiang ................. H01L 27/3225
2020/0052048 A1* 2/2020 Kuo ....................... G06F 1/1686
(Continued)

FOREIGN PATENT DOCUMENTS

CN    108520888 A    9/2018
CN    207947007 U    10/2018
(Continued)

OTHER PUBLICATIONS

First Chinese Office Action dated Apr. 7, 2021, issued in corresponding Chinese Application No. 201910795530.2, filed on Aug. 27, 2019, and its English translation thereof, 15 pages.

*Primary Examiner* — Chanh D Nguyen
*Assistant Examiner* — Nguyen H Truong
(74) *Attorney, Agent, or Firm* — Christensen O'Connor Johnson Kindness PLLC

(57) ABSTRACT

Provided is a display panel having an optical module arrangement region, a transition region and a conventional region. The display panel includes: first pixels located in the optical module arrangement region, transition pixels located in the transition region, conventional pixels located in the conventional region, and first, second, and third pixel circuits. A first pixel density of the optical module arrangement region and a second pixel density of the transition region are both smaller than a third pixel density of the conventional region. The second pixel circuits are located in the transition region and electrically connected to the transition pixels. The third pixel circuits are located in the conventional region and electrically connected to the conventional pixels. The first pixel circuits are electrically connected to the first pixels. At least some of the first pixel circuits are located in the transition region.

17 Claims, 9 Drawing Sheets

(58) Field of Classification Search
CPC ......... H01L 27/12; H01L 27/15; H01L 27/32;
H01L 33/38; H01L 33/24; H01L 33/40;
H01L 33/62; H01L 25/075; H01L 25/18;
G06K 9/00; H04N 5/225; H04N 5/232;
H04N 9/04; G06F 1/16; G06F 1/18
See application file for complete search history.

(56) References Cited

U.S. PATENT DOCUMENTS

| | | | |
|---|---|---|---|
| 2020/0227488 A1* | 7/2020 | Xin | H01L 27/3216 |
| 2021/0013277 A1* | 1/2021 | Liu | H01L 27/3234 |
| 2021/0065625 A1* | 3/2021 | Wang | G09G 3/3233 |
| 2021/0217821 A1* | 7/2021 | Han | H01L 51/001 |
| 2021/0248945 A1* | 8/2021 | Liu | H04N 5/2257 |
| 2021/0272499 A1* | 9/2021 | Shen | G09G 3/3233 |
| 2021/0327958 A1* | 10/2021 | Li | H01L 27/156 |
| 2021/0359031 A1* | 11/2021 | Zheng | G09F 9/33 |
| 2021/0359080 A1* | 11/2021 | Xu | H01L 27/3279 |
| 2021/0408152 A1* | 12/2021 | Lou | H01L 27/326 |

FOREIGN PATENT DOCUMENTS

| | | |
|---|---|---|
| CN | 109148537 A | 1/2019 |
| CN | 109755282 A | 5/2019 |

\* cited by examiner

DISPLAY PANEL AND DISPLAY DEVICE

CROSS-REFERENCE TO RELATED APPLICATIONS

The present application claims priority to Chinese Patent Application No. 201910795530.2, filed on Aug. 27, 2019, the content of which is incorporated herein by reference in its entirety.

TECHNICAL FIELD

The present disclosure relates to the field of display technologies, and in particular, to a display panel and a display device.

BACKGROUND

With the development of the display technology, not only do people require a smooth user experience on electronic products, but also require better visual experiences, so a high screen ratio has become a current research direction. For the electronic products, provision of an optical module such as a front camera will inevitably occupy a certain space, thereby affecting the screen ratio. In order to achieve a true full screen, researchers are considering implementation schemes of under-screen optical modules.

Providing the optical module such as a camera under a light emitting device of the display panel, i.e., providing the optical module in the display area, allows normal display to occur at a position of the optical module. When it is necessary to use the optical module, light penetrates the display panel to reach the optical module and is ultimately utilized by the optical module. In a structure of the display panel in the related art, there is a relatively small amount of light that can be received by the optical module, which affects the use performance of an optical module. How to improve the amount of light received by the optical module and improve the performance of the under-screen optical module is a technical problem that needs to be solved urgently.

SUMMARY

In view of this, embodiments of the present disclosure provide a display panel and a display device, aiming to improve transmittance of light passing through the display panel while improving performances of under-screen optical elements.

In a first aspect, the present disclosure provides a display panel. The display panel has a display area including an optical module arrangement region, a transition region and a conventional region, the transition region surrounding at least a part of the optical module arrangement region, and the conventional region surrounding at least a part of the transition region. The display panel includes: a plurality of pixels provided in the display area and including first pixels located in the optical module arrangement region, transition pixels located in the transition region, and conventional pixels located in the conventional region, wherein a pixel density of the optical module arrangement region is a first density, a pixel density of the transition region is a second density, a pixel density of the conventional region is a third density, and the first density and the second density are both smaller than the third density; and pixel circuits including first pixel circuits, second pixel circuits, and third pixel circuits. The second pixel circuits are located in the transition region and electrically connected to the transition pixels, the third pixel circuits are located in the conventional region and electrically connected to the conventional pixels, and the first pixel circuits are electrically connected to the first pixels and at least some of the first pixel circuits are located in the transition region.

In a second aspect, the present disclosure provides a display device including any display panel provided by the present disclosure.

BRIEF DESCRIPTION OF DRAWINGS

In order to more clearly illustrate technical solutions of representative embodiments of the present disclosure, the accompanying drawings used in the embodiments are briefly described below.

DESCRIPTION OF EMBODIMENTS

In order to better understand technical solutions of the present disclosure, the embodiments of the present disclosure will be described in detail with reference to the drawings.

It should be noted that the described embodiments are representative embodiments of the present disclosure rather than all of the embodiments. Unless stated otherwise, features of embodiments described herein may be combined to form additional embodiments within the scope of the present disclosure.

The terms used in the embodiments of the present disclosure are for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is an association describing the associated object, indicating that there may be three relationships. For example, A and/or B may indicate three cases: only A exists; A and B exist concurrently; only B exists. In addition, a character "/" herein generally indicates that the contextual objects are in an "or" relationship.

In view of the problems existing in the related art, the present disclosure provides a display panel, in which a transition region is provided between an optical module arrangement region and a conventional region and a number of pixel circuits in the transition region is reduced by reducing a pixel density of the transition region, so that a part of pixel circuits for driving pixels located in the optical module arrangement region can be provided in the transition region. With a reasonable arrangement of the pixel circuits, a part of the pixel circuits are moved out of the optical module arrangement region, which increases an area of a light transmission region in the optical module arrangement region, thereby increasing a transmittance of light passing through the display panel in the optical module arrangement region while improving optical performances of the optical module.

Figure 1:
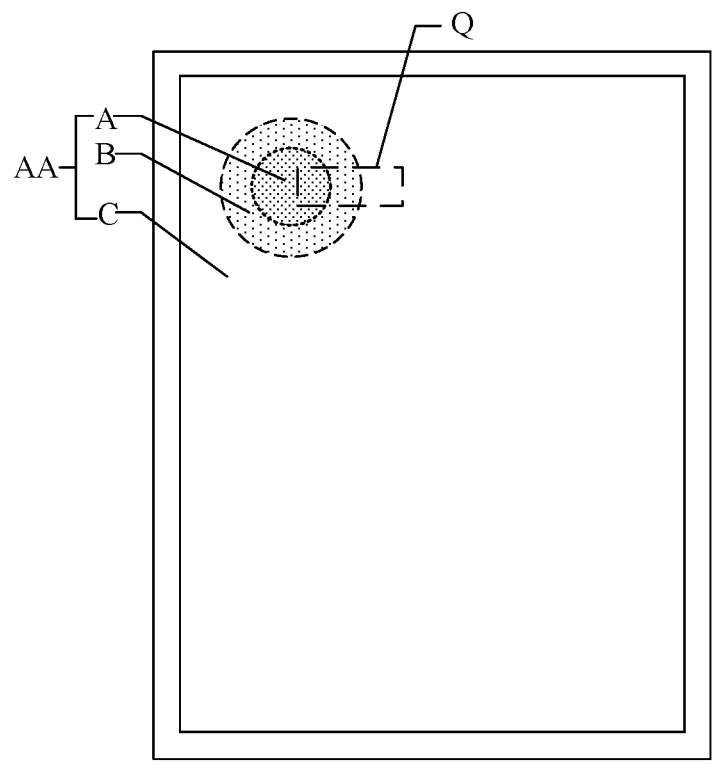
FIG. 1 is a schematic diagram of a display panel according to representative embodiments of the present disclosure.
Figure 2:
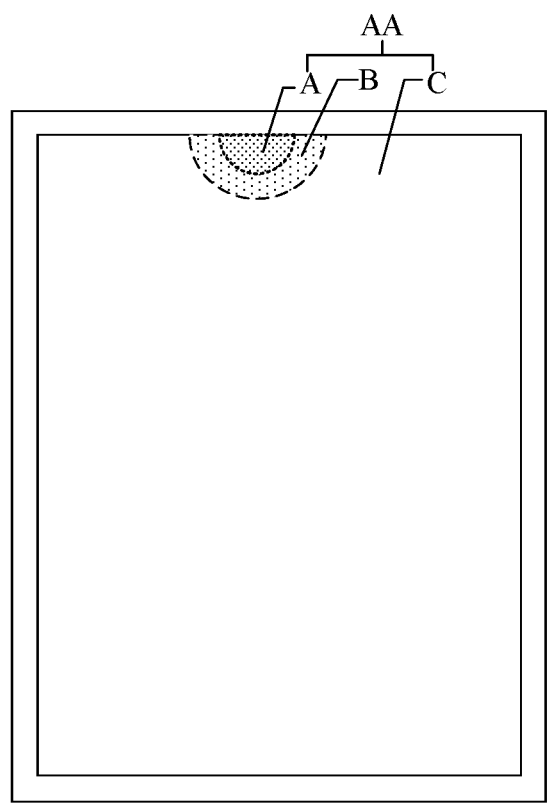
FIG. 2 is another schematic diagram of a display panel according to representative embodiments of the present disclosure.
Figure 3:
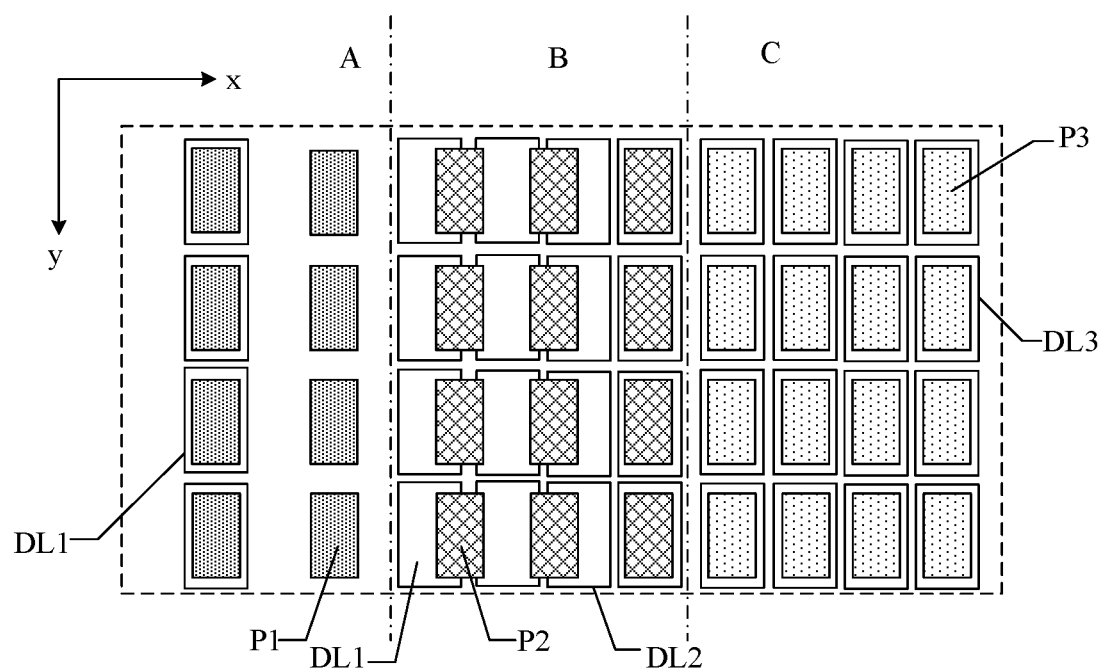
FIG. 3 is an enlarged schematic diagram of a part at a position Q of the display panel as shown in FIG. 1 according to representative embodiments of the present disclosure.

Representative embodiments of the present disclosure provide a display panel. The display panel has a display area. The display area includes an optical module arrangement region, a transition region and a conventional region. The transition region surrounds at least a part of the optical module arrangement region, and the conventional region surrounds at least a part of the transition region. FIG. 1 is a schematic diagram of a display panel according to some embodiments of the present disclosure. FIG. 2 is another schematic diagram of a display panel according to some embodiments of the present disclosure. FIG. 3 is an enlarged schematic diagram of a part at a position Q of the display panel as shown in FIG. 1 according to some embodiments of the present disclosure.

As shown in FIG. 1, the display panel has a display area AA, the display area AA includes an optical module arrangement region A, a transition region B and a conventional region C. As an example, FIG. 1 illustrates that the transition region B encircles the optical module arrangement region A and the conventional region C encircles the transition region B. As shown in FIG. 2, for example, in the display panel, the transition region B surrounds a half of the optical module arrangement region A and the conventional region C surrounds a half of the transition region B. It should be noted that the present disclosure is not limited to any specific position of the optical module arrangement region in the display area, which can be set based on specific requirements in practice. Shapes of the optical module arrangement region A and the transition region B in FIGS. 1 and 2 are representative, and should not be construed as limiting the present disclosure.

Taking the display panel of FIG. 1 as an example, as shown in FIG. 3, a plurality of pixels is provided in the display area, the pixels include first pixels P1 located in the optical module arrangement region A, transition pixels P2 located in the transition region B, and conventional pixels P3 located in the conventional region C. A pixel density of the optical module arrangement region A is a first density, a pixel density of the transition region B is a second density, and a pixel density of the conventional region C is a third density. The first density and the second density are both smaller than the third density. According to the present disclosure, the pixels are divided into the first pixels P1, the transition pixels P2, and the conventional pixels P3 based on regions in which the respective pixels are located. The pixel density refers to a number of pixels included in each inch of a screen.

Still referring to FIG. 3, the display panel further includes pixel circuits. The pixel circuits include first pixel circuits DL1, second pixel circuits DL2, and third pixel circuits DL3. The second pixel circuits DL2 are located in the transition region B and electrically connected to the transition pixels P2, the third pixel circuits DL3 are located in the conventional region C and electrically connected to the conventional pixels P3, and the first pixel circuits DL1 are electrically connected to the first pixels P1 and at least some of the first pixel circuits DL1 are located in the transition region B. In the drawings, the pixel circuits are simplified. Taking the conventional region C as an example, the third pixels P3 overlap the third pixel circuits DL3 for driving such pixels. In the optical module arrangement region A, the first pixel circuits DL1 that are not moved out of the region overlap the first pixels P1 driven thereby. In the transition region B, a part of the second pixels P2 overlap the second pixel circuits DL2 for driving such pixels (e.g., only overlap the second pixel circuits DL2), and another part of the second pixels P2 may overlap the first pixel circuits DL1 that are moved into the transition region B. As an example, the first pixel circuits DL1 that are moved into the transition region B may not overlap the second pixels P2.

Taking a first direction x and a second direction y as illustrated in FIG. 3 as an example, e.g., the first direction x is a row direction and the second direction y is a column direction, the pixel density of the optical module arrangement region A being smaller than the pixel density of the conventional region C 3 can be achieved by reducing a number of pixel columns arranged in the second direction y, and the pixel density of the transition region B being smaller than the pixel density of the conventional region C can be also achieved by reducing the number of pixel columns arranged in the second direction y. Alternatively, for both the optical module arrangement region A and the transition region B, the pixel density can also be reduced by reducing a number of pixel rows arranged in the first direction x. It is also possible that for both the optical module arrangement region A and the transition region B, the pixel density can be reduced by reducing the number of pixels arranged in both the first direction x and the second direction y.

The display panel according to some embodiments of the present disclosure can be an organic light-emitting display panel. The display panel includes light-emitting elements. Generally, one pixel includes one light-emitting element, and a region in which the light-emitting element is located is the light-emitting region of the pixel. The light-emitting element includes an anode, a light-emitting layer and a cathode that are sequentially stacked. In order to improve the light utilization rate, the anode is usually formed into a reflective anode. Light emitted from the light-emitting layer penetrates the cathode to achieve light emitting and display of the pixel. There is very little light emitted from the light-emitting layer that can penetrate the anode, so a region in which the light-emitting element is located is usually considered as a non-light transmission region of the display panel. The non-light transmission region refers to a region where light cannot penetrate. In addition, since the display panel further includes pixel circuits for driving the pixels to emit light and various metal traces, which may block light, causing light to not penetrate the display panel. Therefore, a region in which the pixel circuits and metal traces are located also belongs to the non-light transmission region. A region between two adjacent light-emitting elements in the display area of the display panel is not entirely a light-transmission area. Therefore, an area of the whole light-transmission area in the display area is very small, so that an amount of light that can penetrate the display panel is small. When an under-screen optical module solution is applied, the amount of light that can be utilized by the optical module is small, resulting in poor optical performances of the under-screen optical module, thereby affecting the user experience.

In some embodiments of the present disclosure, the optical module arrangement region A is an optical module reserve region, and has a smaller pixel density than the conventional region C. When assembled into a display device, an optical module such as a camera can be provided at a position corresponding to the optical module arrangement region A. When a display function is required, normal display can be performed in the optical module arrangement region A. When a camera function is required, light can pass through the display panel from the optical module arrangement region and then be utilized by the camera. With the present disclosure, the pixel density of the optical module arrangement region A is smaller than the pixel density of the conventional region C, and then the number of pixels in the optical module arrangement region is decreased and thus the number of pixel circuits for driving the pixels to perform display is also decreased, thereby reducing an area of the non-light transmission region in the optical module arrangement region. Correspondingly, areas of the corresponding light transmission regions will increase, which can increase the amount of light that penetrates the optical module arrangement region while improving the optical performance of the optical module under the screen. Further, according to the present disclosure, the transition region B is provided between the optical module arrangement region A and the conventional region C, and the pixel density of the transition region B is smaller than the pixel density of the conventional region C. Thus, the number of the second pixel circuits that need to be provided in the transition region B is decreased. The present disclosure arranges at least some of the first pixel circuits in the transition region. That is, by reducing the pixel density of the transition region, a part of the pixel circuits for driving the first pixels in the optical module arrangement region can be provided in the transition region. With a reasonable arrangement of the pixel densities and the pixel circuits, at least some of the pixel circuits are moved out of the optical module arrangement region, which increases an area of a light transmission region in the optical module arrangement region, thereby increasing a transmittance of light passing through the display panel in the optical module arrangement region while improving optical performances of the under-screen optical module.

Figure 4:
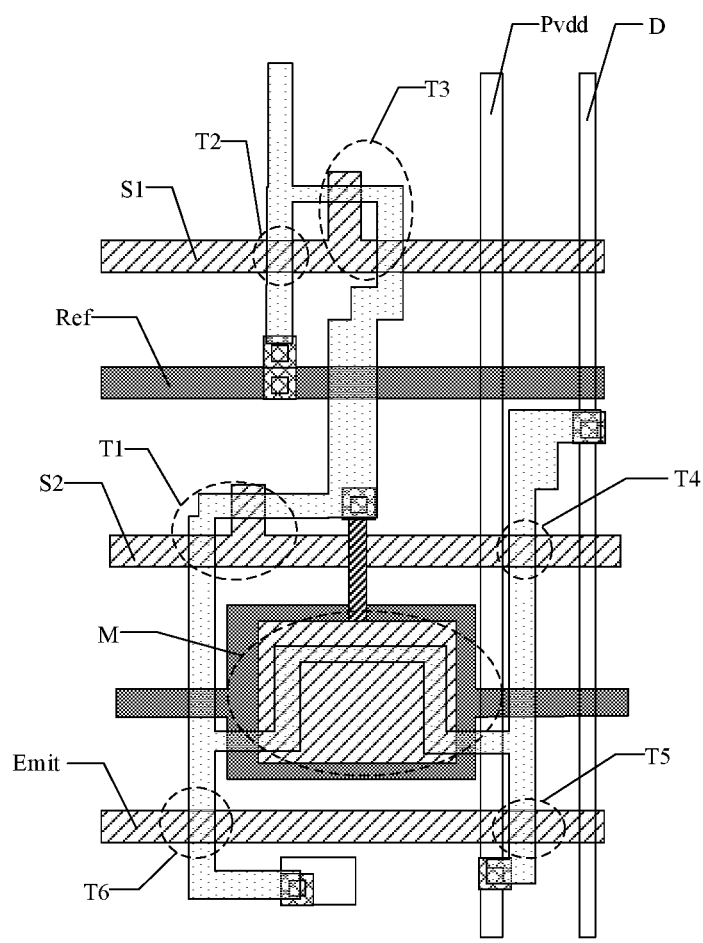
FIG. 4 is a schematic diagram of a pixel circuit of a display panel according to representative embodiments of the present disclosure.

FIG. 4 is a schematic diagram of a pixel circuit of a display panel according to some embodiments of the present disclosure. As shown in FIG. 4, the pixel circuit includes a first scan line S1, a second scan line S2, a light-emitting control signal line Emit, a data line D, a power signal line Pvdd, a reset signal line Ref, first to sixth switches (T1 to T6), and a driver M. The pixel circuit usually includes a plurality of transistors and a plurality of signal lines. In order to drive the display panel to perform display, the pixel circuits are densely arranged in an array layer of the display panel. It should be noted that the pixel circuit in FIG. 4 is representative and is not intended to limit the present disclosure.

In the display panel according to some embodiments of the present disclosure, a region corresponding to the optical module under the screen is reserved as the optical module arrangement region. For example, when applying an under-screen camera solution, a gap between various signal lines in the pixel circuit (referring to FIG. 4, e.g., a gap between the data line D and the power signal line Pvdd, a gap between the first scan line S1 and the reset signal line Ref, and the like) can diffract light that passes through the optical module arrangement region, which is then utilized by the camera. This will seriously affect an imaging quality of the camera. Therefore, the present disclosure further increases sizes of a part of the transition pixels that are located in the optical module arrangement region and adjacent to the transition region, and then uses the transition pixels for covering the gap between traces in the pixel circuit, thereby alleviating diffraction impact on the performance of optical module.

Figure 5:
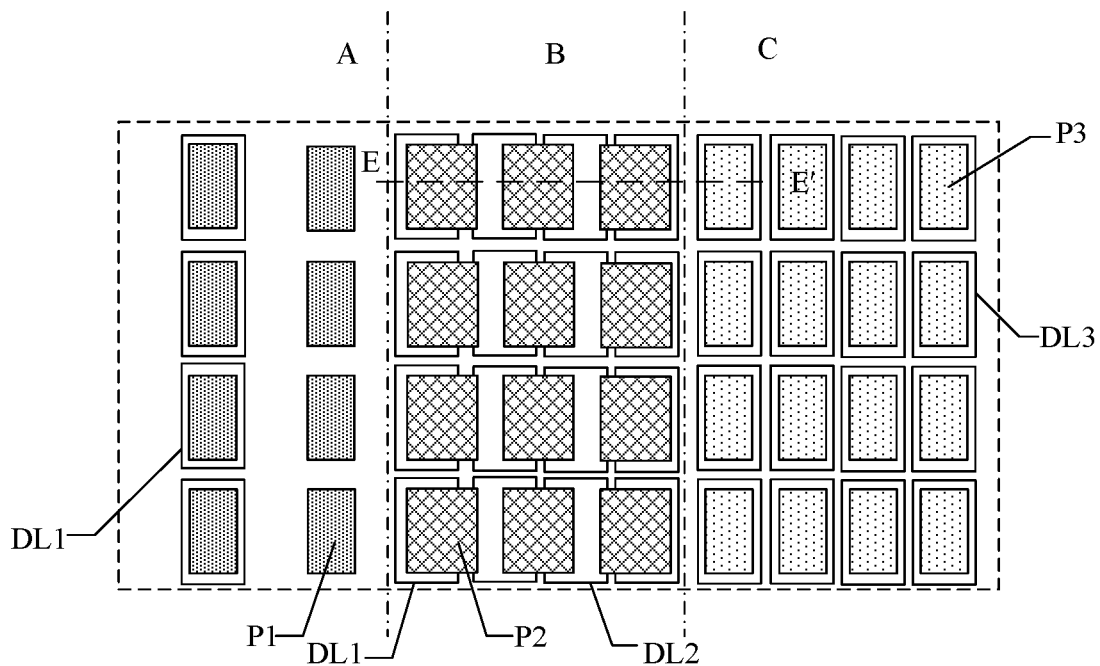
FIG. 5 is another enlarged schematic diagram of a part at a position Q of the display panel as shown in FIG. 1 according to representative embodiments of the present disclosure.

In some embodiments, FIG. 5 is another enlarged schematic diagram of a part at a position Q of the display panel as shown in FIG. 1 according to some embodiments of the present disclosure. As shown in FIG. 5, an area of the transition pixel P2 is larger than that of the conventional pixel P3. In the transition region B, a part of the transition pixels P2 overlap the first pixel circuits DL1, thereby covering at least some of gaps between traces of the first pixel circuits DL1. The pixel in the display panel includes an anode, a light-emitting layer, and a cathode that are sequentially stacked in a direction perpendicular to the display panel. Viewed from the top of FIG. 5, the anode, the light-emitting layer, and the cathode overlap, and a structure having the largest area among the anode, the light-emitting layer, and the cathode defines an area of the corresponding pixel.

Figure 6:
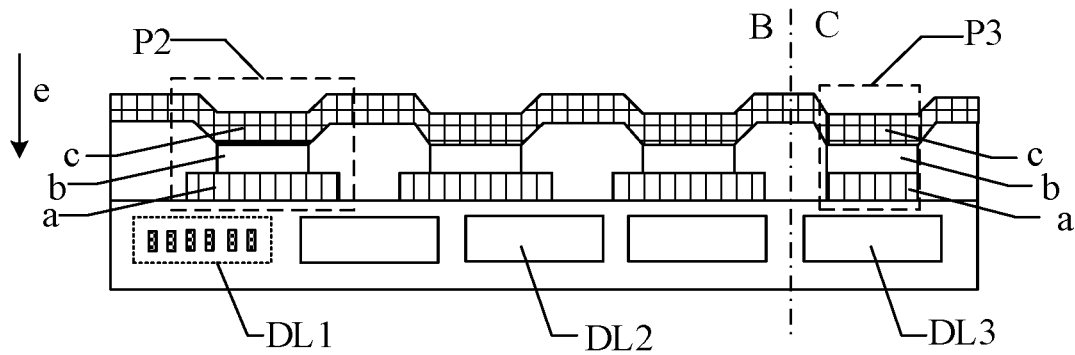
FIG. 6 is a cross-sectional schematic diagram taken along line E-E' in FIG. 5 according to representative embodiments of the present disclosure.

In some embodiments, areas of anodes of a part of the transition pixels are increased, so that the transition pixels can be used to cover gaps between traces in the first pixel circuits. FIG. 6 is a cross-sectional schematic diagram taken along line E-E' in FIG. 5 according to some embodiments of the present disclosure. As shown in FIG. 6, a pixel includes an anode a, a light-emitting layer b, and a cathode c that are sequentially stacked. An area of the anode a of the transition pixel P2 is larger than an area of the anode a of the conventional pixel P3. In a direction e perpendicular to a plane of the display panel, the anodes of at least some of the transition pixels P2 overlap a gap between traces of the first pixel circuits DL1. The actual pixel circuit has complicated wiring, and a circuit structure and the gap between traces cannot be completely illustrated in the cross-sectional view. In FIG. 6, the gap between traces in the first pixel circuit DL1 is schematically shown. FIG. 6 illustrates that an area of an anode of a transition pixel P2 that does not overlap the first pixel circuit DL1 also becomes larger. For example, it is possible to set the area of the anode of the transition pixel P2 that overlaps the first pixel circuit DL1 to be larger than that of the conventional pixel. In the display panel according to the present embodiment, the pixel density of the transition region is smaller than that of the conventional region, which reduces the number of second pixel circuits provided in the transition region for driving the transition pixels, and then at least some of the first pixel circuits are provided in the transition region, which can increase the amount of light that penetrates the optical module transmission while improving the optical performance of the optical module under the screen. Further, the area of the anode of the transition pixel is set to be larger than the area of the anode of the conventional pixel, and a blocking performance of the anode of the transition pixel can be used to block a gap between at least some of traces of the first pixel circuits, thereby reducing diffraction of light around the optical module arrangement region so as to improve performances of the optical module when applying the under-screen optical module solution.

As an example, the gap between traces of the first pixel circuit located in the transition region is completely covered by the anodes of the transition pixels. In some embodiments of the present disclosure, at least some of the first pixel circuits is disposed in the transition region, so that the number of the first pixel circuits disposed in the optical module arrangement region can be reduced, which reduces an area of the non-light transmission region in the optical module arrangement region and correspondingly increases the area of the light transmission region, thereby improving the light transmittance of the optical module arrangement region and thus improving light available to the optical module under the screen in the optical module arrangement region. Further, the gap between traces of the first pixel circuits in the transition region is completely covered by the anode of the transition pixel, which can minimize and eliminate light diffraction caused by the wiring of the first pixel circuits in the transition region, thereby effectively improving performances of the optical module when applying the under-screen optical module solution.

Figure 7:
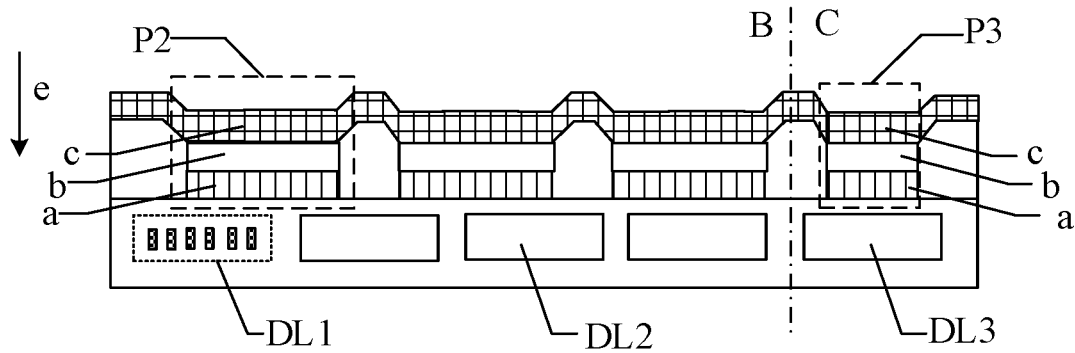
FIG. 7 is another cross-sectional schematic diagram taken along line E-E' in FIG. 5 according to representative embodiments of the present disclosure.

In some embodiments, a light-emitting area of the transition pixel is larger than that of the conventional pixel. By increasing areas of anodes, light-emitting layers area, and cathodes of a part of the transition pixels at the same time, the transition pixels can be used to block the gap between traces of the first pixel circuits. FIG. 7 is another cross-sectional schematic diagram taken along line E-E' in FIG. 5 according to some embodiments of the present disclosure. As shown in FIG. 7, a pixel includes an anode a, a light-emitting layer b, and a cathode c that are sequentially stacked. The light-emitting area of the transition pixel P2 is larger than that of the conventional pixel P3. The area of the anode a of the transition pixel P2 is larger than the area of the anode a of the conventional pixel P3. The area of the light-emitting layer b of the transition pixel P2 is larger than the area of the light-emitting layer b of the conventional pixel P3. FIG. 7 illustrates that the areas of the anode and the light-emitting layer of the transition pixel P2 that does not overlap the first pixel circuit DL1 are also increased. For example, it is possible to increase the areas of the anode and the light-emitting layer of the transition pixel P2 that overlaps the first pixel circuit DL1. In this embodiment, at least some of the first pixel circuits are disposed in the transition region, which can increase the area of the light transmission region in the optical module arrangement region while improving the light transmittance of the optical module arrangement region. Further, the light-emitting area of the transition pixel is increased, and at least some of the gap between traces of the first pixel circuits are blocked by the transition pixels, so as to reduce the diffraction effect of the light by the gap between traces of the first pixel circuits, that is to reduce diffraction of light around the optical module arrangement region, thereby improving performances of the optical module when applying the under-screen optical module solution. In addition, according to the present disclosure, the pixel density of the transition region is smaller than the pixel density of the conventional region. In order to ensure that the brightness of the transition region is consistent with that of the conventional region, it may be needed to provide a data voltage signal for increasing the transition pixels. In this embodiment, after the light-emitting area of the transition pixel becomes larger, a current density of the transition pixels can be correspondingly reduced, thereby facilitating improving lifetime of the transition pixels.

In some embodiments, in the display panel, the number of the first pixels in the optical module arrangement region is N, and the number of the first pixel circuits in the transition region is n, where $0.3 \leq n/N \leq 0.8$. n/N represents a proportion of the first pixel circuits in the transition region among all the first pixel circuits. n/N=0.3 means that 30% of the first pixel circuits are moved out of the optical module arrangement region and then disposed in the transition region, and n/N=0.8 means that 80% of the first pixel circuits are moved out of the optical module arrangement region and then disposed in the transition region. In a practical application, the proportion of the first pixel circuits to be designed in the transition region is related to factors such as a size of the optical module arrangement region, the pixel density of the transition region, a total number of pixel circuits that can be arranged in the transition region, a degree of difficulty of manufacturing process, display effects in the transition region and the optical module arrangement region, and the like. After comprehensive consideration of the influence of various factors, it is designed that $0.3 \leq n/N \leq 0.8$. In this design, the pixel density of the transition region does not need to be too small, so as to ensure that there is no obvious display boundary between the transition region and the conventional region during normal display and more first pixel circuits can be placed in the transition region, which can greatly increase an area of the light transition region of the optical module arrangement region while improving the light transmittance. For example, in the display area, the pixels and the pixel circuits are electrically connected in one-to-one correspondence.

Figure 8:
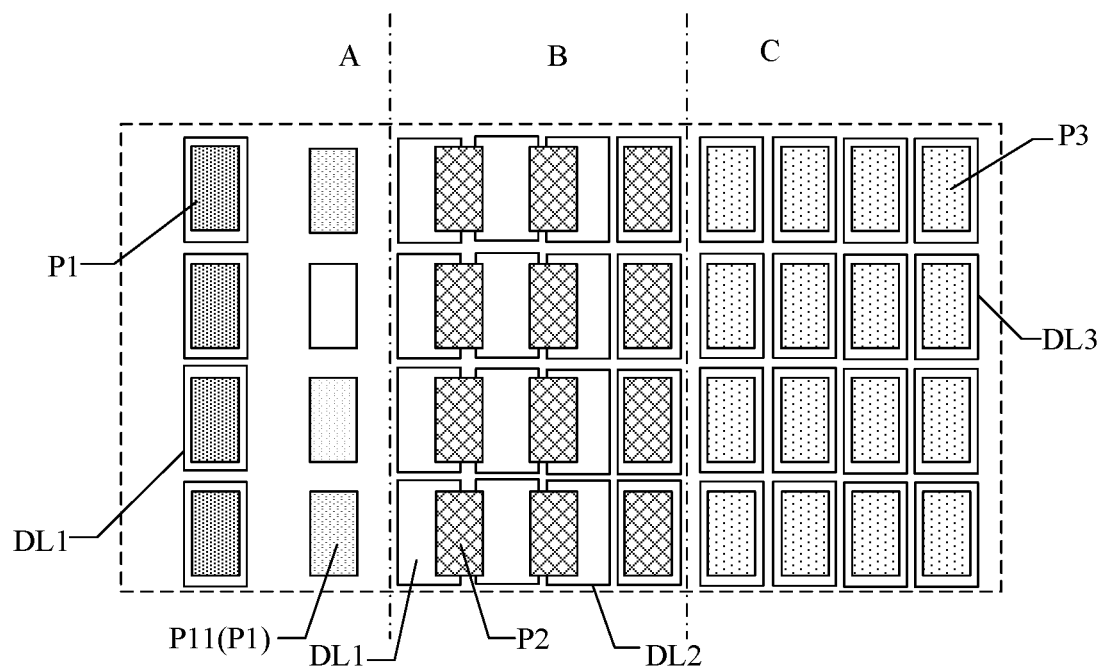
FIG. 8 is a schematic diagram of a part of a display panel according to representative embodiments of the present disclosure.

FIG. 8 is a schematic diagram of a part of a display panel according to some embodiments of the present disclosure. As shown in FIG. 8, the first pixels P1 include first edge pixels P11, and the first edge pixels P11 are adjacent to the transition region B. At least some of the first pixel circuits DL1 that are electrically connected to the first edge pixels P11 are located in the transition region. B. The pixel circuits for driving pixels to perform display in the display panel are also densely arranged. The first edge pixels are adjacent to the transition region. In this embodiment, the first pixel circuits that are electrically connected to the first edge pixels are provided in the transition region. Such pixel circuits are adjacent to the transition region until some design changes are made, and then are moved into the transition region during the manufacturing. This has little impact on arrangement of other pixel circuits in the display panel, and the process is simple.

Figure 9:
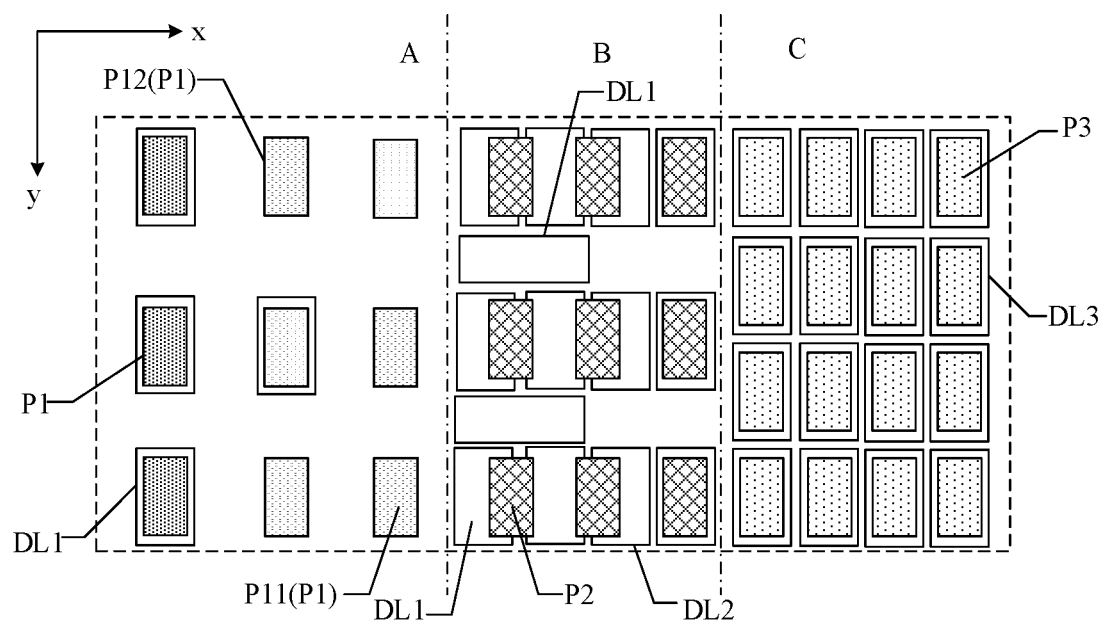
FIG. 9 is another schematic diagram of a part of a display panel according to representative embodiments of the present disclosure.

FIG. 9 is another schematic diagram of a part of a display panel according to some embodiments of the present disclosure. As shown in FIG. 9, the first pixels P1 further include secondary edge pixels P12. The secondary edge pixels P12 are located at a side of the first edge pixels P11 facing away from the transition region B and adjacent to the first edge pixels P11. At least some of the first pixel circuit DL1 electrically connected to the first edge pixels P11 are located in the transition region B, and at least some of the first pixel circuit DL1 electrically connected to the secondary edge pixels P12 are located in the transition region B. The secondary edge pixels P12 are spaced from the transition region by the first edge pixels P11, that is, the secondary edge pixels P12 are closer to the transition region. The first pixel circuits DL1 electrically connected to the secondary edge pixels P12 are moved into the transition region B. The overall arrangement of the pixel circuits in the display panel has less impact, is relatively simple in design, and has low process difficulty.

It should be noted that the arrangement of the pixel circuits in the transition region B in FIG. 9 is representative. After providing at least some of the first pixel circuits DL1 in the transition region, it may have an impact on the arrangement of the second pixel circuits DL2 in the transition region. In the actual manufacturing, after a circuit structure of a pixel circuit is determined, the pixel circuit occupies a basically unchanged area, but an arrangement position of each component in the pixel circuit can be adjusted to achieve an adjustment of occupied lengths of the pixel circuit in the first direction x and the second direction y as shown in FIG. 9, so as to achieve a reasonable arrangement of the pixel circuits in the transition region B in such a manner that at least some of the first pixel circuits are arranged in the transition region B, thereby increasing the area of the light transmission area in the optical module arrangement region A while increasing the light transmittance of the optical module arrangement region A.

Figure 10:
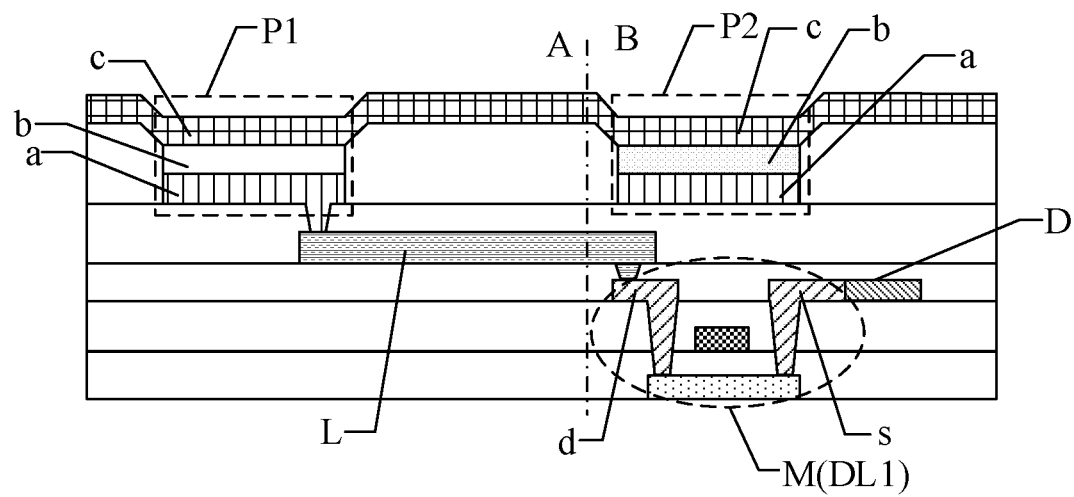
FIG. 10 is a schematic diagram illustrating a film layer structure of a display panel according to representative embodiments of the present disclosure.

FIG. 10 is a schematic diagram illustrating a film layer structure of a display panel according to some embodiments of the present disclosure. As shown in FIG. 10, the pixel includes an anode a, a light-emitting layer b, and a cathode c that are sequentially stacked. The display panel further includes a first connection trace L. The first pixel circuit DL1 located in the transition region is electrically connected to the anode a of the first pixel P1 via the first connection trace L. The display panel further includes a data line D, and the first connection trace L and the data line D are disposed in different layers. The data line D provides a data signal to the pixel circuit. The figure illustrates a driver M in the pixel circuit, a drain d of the driver M is electrically connected to the anode a of the pixel, and a source s of the driver M is electrically connected to the data line D. The drain d of the driver M of the first pixel circuit DL1 is connected to the first connection trace L, and the first connection trace L and the anode a are disposed in different layers and electrically connected to each other through a via. The driver M in FIG. 10 is schematically described in a top-gate structure. In a display panel in the related art, usually, a pixel circuit is disposed below a pixel, and a drain of a driver in the pixel circuit and an anode of the pixel are electrically connected to each other through a via on an insulating layer. In some embodiments of the present disclosure, at least some of the first pixel circuits electrically connected to the first pixels are disposed in the transition region, that is, the first pixel circuits located in the transition region and the first pixels driven thereby are misaligned. On this basis, a first solution lies in that a wiring made in the same layer as the anode and electrically connected to the anode extends to a position corresponding to the drain of the driver, and then is electrically connected to the drain through a via, and a second solution lies in that a wiring made in the same layer as the drain of the driver and electrically connected to the drain extends to a position corresponding to the anode of the pixel, and then is electrically connected to the anode through a via. For the first solution, since the wiring made in the same layer as the anode occupies a certain space at a position of the optical module arrangement region adjacent to the transition region, the first pixels and the transition pixel do not overlap the wiring in a direction perpendicular to the display panel, which will adversely affect the solution in which the transition pixels cover the gap between traces of the first pixel circuits. For the second solution, since the wiring in the pixel circuit in the display panel is complex and dense, if the wiring is simply made in the same layer as the drain, the arrangement of the pixel circuits needs to be changed in order to avoid short circuit. In view of this, a further embodiment is proposed, in which a first connection trace provided in a different layer from the data line is added. The first connection trace achieves an electrical connection between the first pixel circuit located in the transition region and the first pixel located in the optical module arrangement region, thereby improving the light transmittance of the optical module arrangement region while introducing little impact on the arrangement of the pixel circuits in the transition region and causing the simple manufacturing process.

Figure 11:
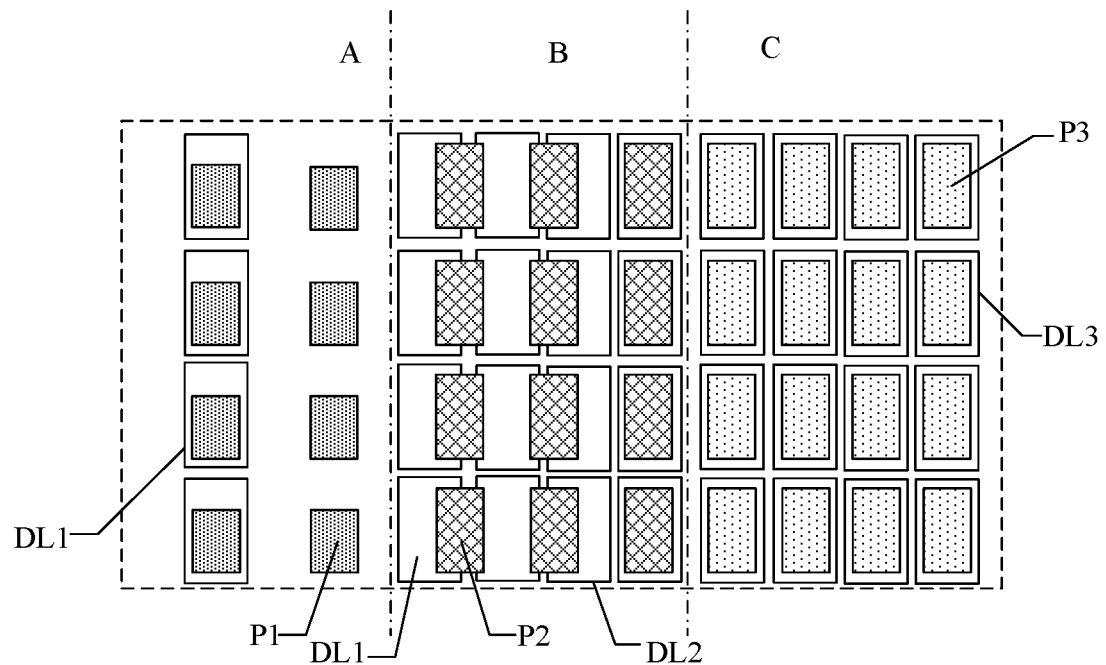
FIG. 11 is another schematic diagram of a part of a display panel according to representative embodiments of the present disclosure.

FIG. 11 is another schematic diagram of a part of a display panel according to some embodiments of the present disclosure. As shown in FIG. 11, the light-emitting area of the first pixel P1 is smaller than that of the conventional pixel P3. In this embodiment, the pixel density of the optical module arrangement region is smaller than that of the conventional region, and the amount of light that penetrates the optical module arrangement region is increased. A transition region is provided between the optical module arrangement region and the conventional region, and has a smaller pixel density than the conventional region. At least some of the first pixel circuits are provided in the transition region, that is, by reducing the pixel density of the transition region, a part of the pixel circuits for driving the first pixels in the optical module arrangement region can be provided in the transition region, which can reduce the area of the non-light transmission region in the optical module arrangement region, thereby correspondingly increasing the area of the light transmission region in the optical module arrangement region. Further, the light-emitting area of the first pixels in the optical module arrangement region is smaller than that of the conventional region, which can further reduce the area of the non-light transmission region in the optical module arrangement region, thereby increasing transmittance of the light penetrating the display panel in the optical module arrangement region.

Figure 12:
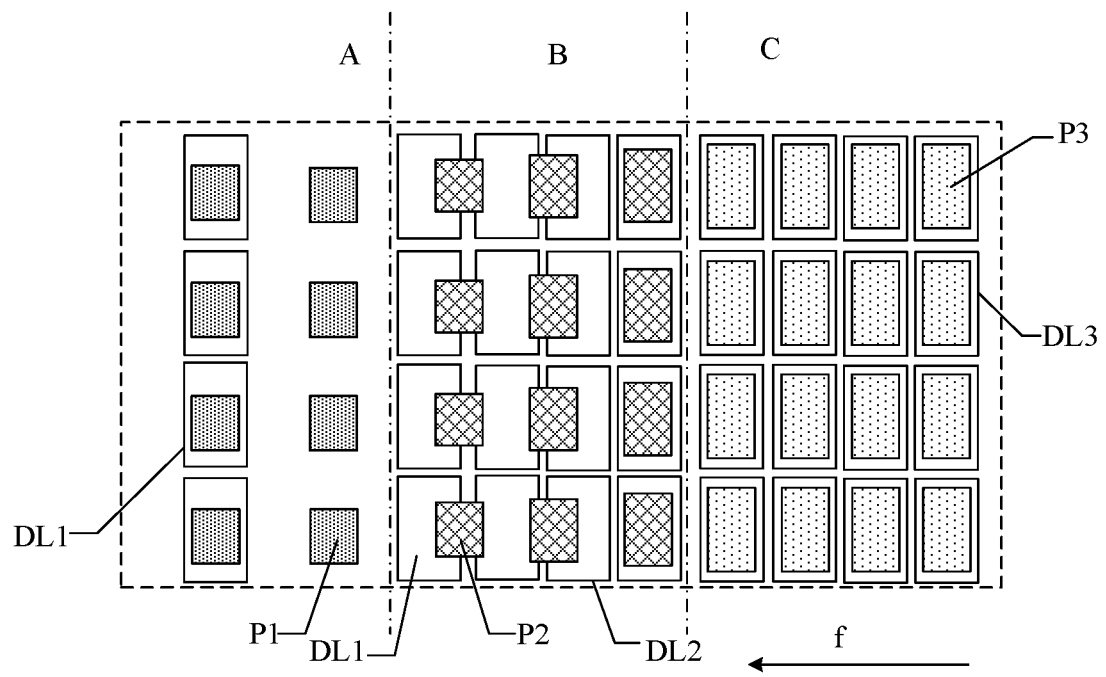
FIG. 12 is another schematic diagram of a part of a display panel according to representative embodiments of the present disclosure.

FIG. 12 is another schematic diagram of a part of a display panel according to some embodiments of the present disclosure. As shown in FIG. 12, the light-emitting area of the first pixel P1 is smaller than that of the conventional pixel P3. In a direction f from the conventional region C to the optical module arrangement region A, the light emitting areas of the transition pixels P2 gradually decrease. In this embodiment, at least some of the first pixel circuits are provided in the transition region, and the light-emitting area of the first pixel is smaller than that of the conventional pixel, thereby improving the light transmittance of the optical module arrangement region. Further, in a direction from the conventional region towards the optical module arrangement region, the light-emitting areas of the transition pixels gradually decrease, thereby ensuring that the conventional regional gradually transitions to the optical module arrangement region during display while preventing the human eye from differentiating display between the conventional region and the transition region or between the optical module arrangement region and the transition region. This embodiment can improve the display effect. For example, the light-emitting area of the transition pixel is smaller than or equal to the light-emitting area of the conventional pixel.

In some embodiments, the light-emitting area of the first pixel is smaller than the light-emitting area of the conventional pixel, and the light-emitting areas of the transition pixels gradually increase first and then gradually decrease in the direction from the conventional region towards the optical module arrangement region. This embodiment improves the light transmittance of the optical module arrangement region, and also achieves that the conventional region gradually transitions to the optical module arrangement region during display while preventing the human eye from differentiating display between the conventional region and the transition region or between the optical module arrangement region and the transition region. For example, the light-emitting area of the transition pixel is greater than or equal to the light-emitting area of the conventional pixel.

Figure 13:
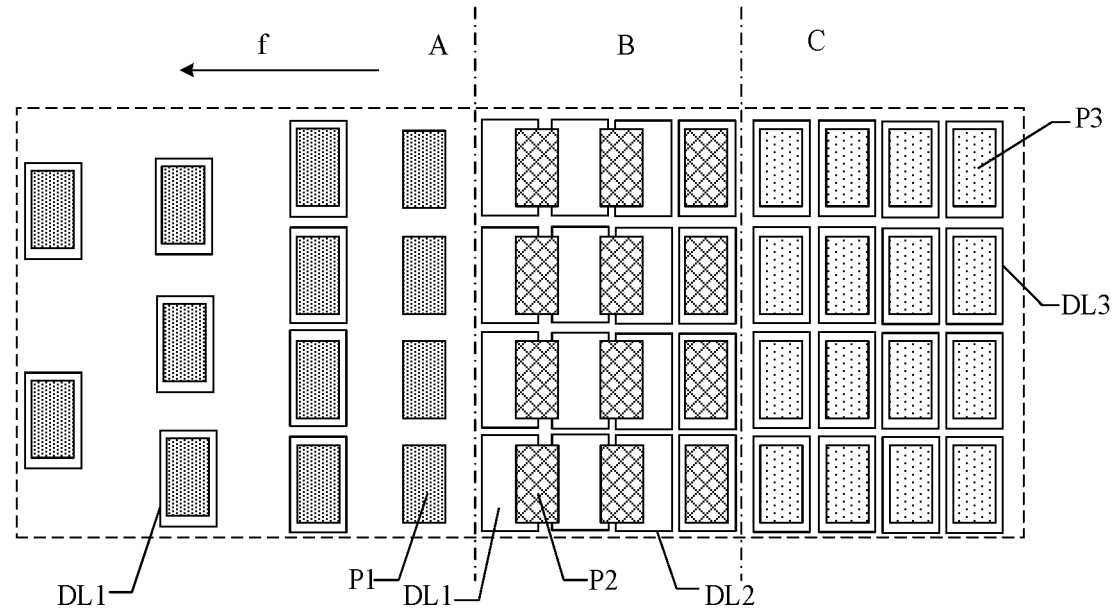
FIG. 13 is another schematic diagram of a part of a display panel according to representative embodiments of the present disclosure.

FIG. 13 is another schematic diagram of a part of a display panel according to some embodiments of the present disclosure. As shown in FIG. 13, the light-emitting area of the first pixel P1 is the same as that of the conventional pixel P3, and the pixel density of the optical module arrangement region A gradually increases in the direction f from the conventional region C to the optical module arrangement region A. In this embodiment, at least some of the first pixel circuits are first disposed in the transition region, thereby improving the light transmittance of the optical module arrangement region. Further, the pixel density of the optical module arrangement region gradually decreases in the direction from the conventional region towards the optical module arrangement region. The pixel density of the optical module arrangement region gradually changes along one direction, display in the optical module arrangement region changes uniformly during display, and thus it is not easy for the human eye to recognize the display difference. In addition, as the pixel density gradually decreases, the number of pixels provided in the optical module arrangement region can be further reduced, thereby further improving the light transmittance of the optical module arrangement region.

As an example, in the embodiment corresponding to FIG. 13, the light-emitting area of the transition pixel can be set to be the same as that of the conventional pixel, the light-emitting area of all pixels in the display area can be set to be the same, the pixel density of the transition region can be set to be smaller than that of the conventional region, and the pixel density of the transition region is greater than that of the optical module arrangement region. In this way, in the direction from the conventional region towards the optical module arrangement region, the light-emitting area of the pixel does not change, but the pixel density gradually changes, which can achieve a uniform transition during the display while improving the display effect.

As another example, in the embodiment corresponding to FIG. 13, the light-emitting area of the transition pixel can alternatively be set to be larger than that of the conventional pixel. The transition pixels can be arranged in the transition region to block at least some of the gap between traces of the first pixel circuits, which can reduce the diffraction effect of the gap between traces of the first pixel circuits on the light penetrating the display panel, thereby improving performances of the optical module when applying the under-screen optical module scheme. For example, it is also possible that the light-emitting areas of the transition pixels gradually increase first and then decrease in the direction from the conventional region to the optical module arrangement region, so that the light-emitting area of the transition pixel is larger than that of the conventional pixel, and the light-emitting area of the transition pixel is larger than the light-emitting area of the first pixel. The transition region is located between the conventional region and the optical module arrangement region. That is, the light-emitting areas of the pixels gradually change by first increasing and then decreasing in the direction from the conventional region towards the optical module arrangement region, thereby achieving a uniform transition during display while improving the display effect.

It should be noted that FIG. 13 illustrates a part of the optical module arrangement region A, a part of the transition region B, and a part of the conventional region C. For the embodiment in which the transition region B surrounds the optical module arrangement region A and the conventional region C surrounds the transition region B, it is possible that the pixel density of the optical module arrangement region A gradually decreases in a direction from the conventional region C towards a geometric center of the optical module arrangement region A.

Figure 14:
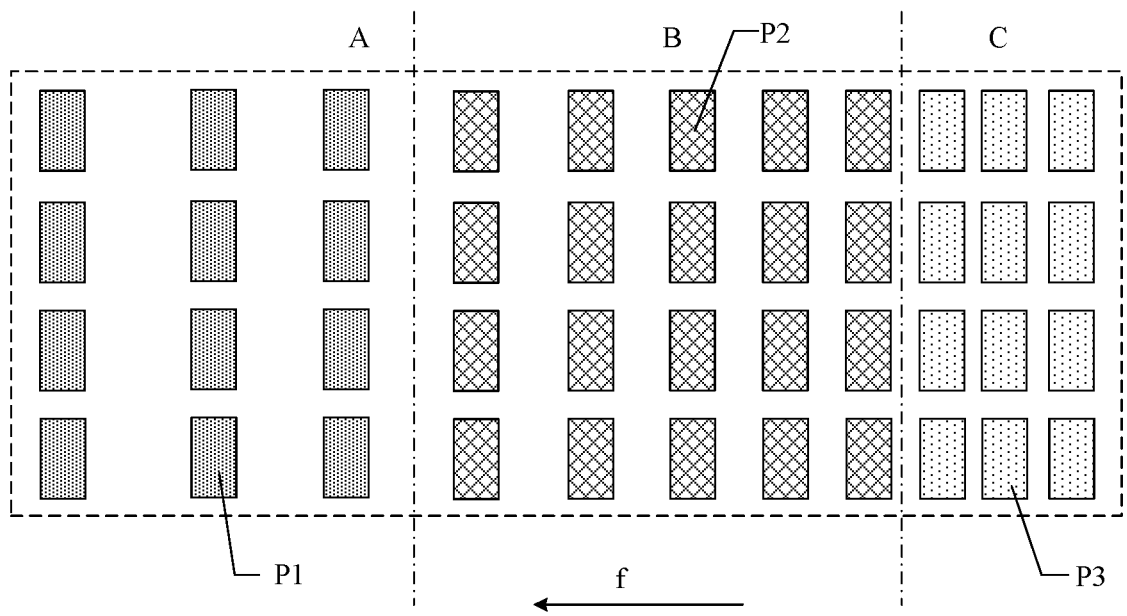
FIG. 14 is another schematic diagram of a part of a display panel according to representative embodiments of the present disclosure.

FIG. 14 is another schematic diagram of a part of a display panel according to some embodiments of the present disclosure. As shown in FIG. 14, in the direction from the conventional region C towards the optical module arrangement region A, the pixel density of the transition region B gradually decreases. In order to clearly illustrate the change in pixel density, the pixel circuits in the display panel are not shown in the figure. In this embodiment, at least some of the first pixel circuits are provided in the transition region, and the light transmittance of the optical module arrangement region is improved. Further, the pixel density of the transition region gradually decreases in the direction from the conventional region to the optical module arrangement region. The setting of the transition region ensures that the display gradually transitions along a direction from the conventional region towards the optical module arrangement region during display, thereby improving the display effect. For example, the pixel density of the transition region can be set to be greater than the pixel density of the optical module arrangement region, which can further achieve a uniform transition from the transition region to the optical module arrangement region.

Figure 15:
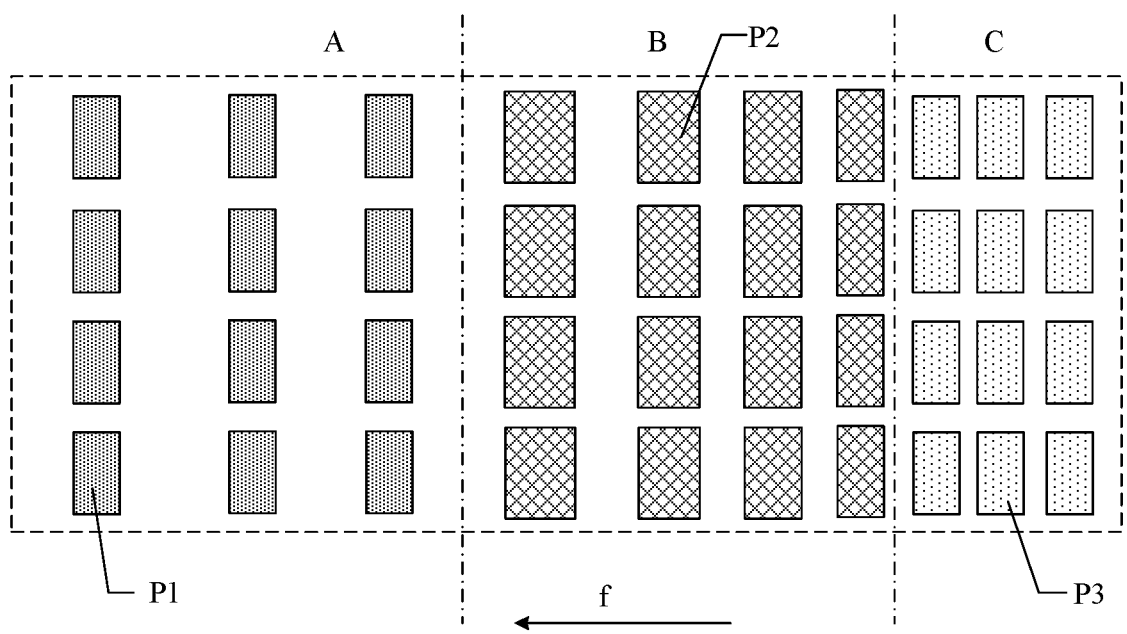
FIG. 15 is another schematic diagram of a part of a display panel according to representative embodiments of the present disclosure.

FIG. 15 is another schematic diagram of a part of a display panel according to some embodiments of the present disclosure. As shown in FIG. 15, in the direction from the conventional region C towards the optical module arrangement region A, the pixel density of the transition region B gradually decreases. In the direction from the conventional region C towards the optical module arrangement region A, the light-emitting areas of the transition pixels P2 gradually increase. In this embodiment, based on the implementation of FIG. 14, the light-emitting areas of the transition pixels gradually increase, which can balance the difference in display brightness caused by the gradually decreasing of the pixel density in the transition region while achieving uniform display brightness in the transition region. In addition, after the light-emitting areas of the transition pixels increase, at a position in the transition region adjacent to the optical module arrangement region, the transition pixels can be used to block the gap between traces of the first pixel circuits located in the transition region, which can reduce the diffractive effect of the gap between traces on light, thereby reducing the impact of the diffraction of light around the optical module arrangement region on the performances of the under-screen optical module.

Figure 16:
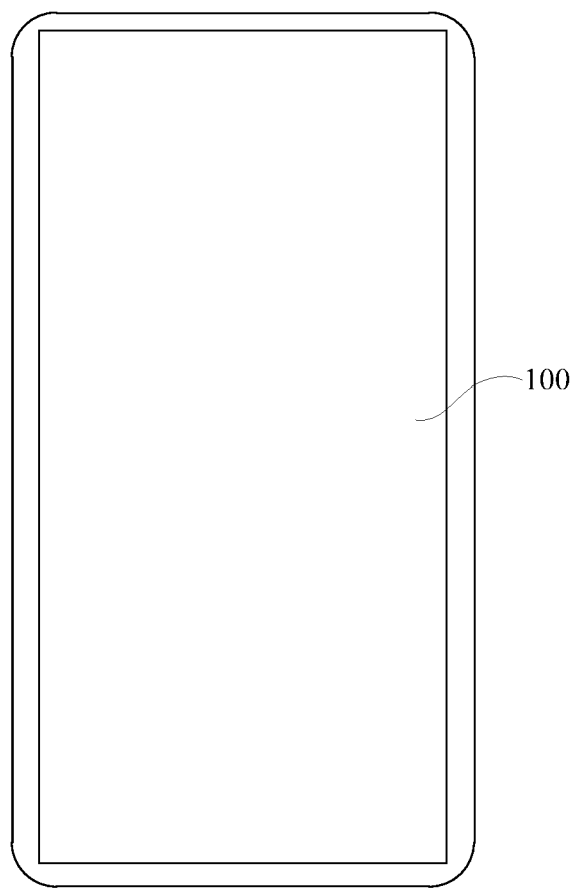
FIG. 16 is a schematic diagram of a display device according to representative embodiments of the present disclosure.

Based on the same inventive concept, the present disclosure also provides a display device. FIG. 16 is a schematic diagram of a display device according to some embodiments of the present disclosure. As shown in FIG. 16, the display device includes the display panel 100 provided by any embodiment of the present disclosure. The specific structure of the display panel 100 has been described in detail in the above embodiments, and details are not described herein again. Without doubt, the display device shown in FIG. 16 is representative, and the display device can be any electronic device having a display function such as a mobile phone, a tablet computer, a notebook computer, an electronic paper book, or a television set.

The above describes representative embodiments of the present disclosure and is not intended to limit the present disclosure. Any modifications, equivalent substitutions, improvements, etc. made within the spirit and principle of the present disclosure are intended to be included within the scope of the present disclosure.

What is claimed is:

1. A display panel having a display area having an optical module arrangement region, a transition region, and a conventional region, the transition region surrounding at least a part of the optical module arrangement region, and the conventional region surrounding at least a part of the transition region, the display panel comprising:
a plurality of pixels provided in the display area, the plurality of pixels comprising first pixels located in the optical module arrangement region, transition pixels located in the transition region, and conventional pixels located in the conventional region, wherein a pixel density of the optical module arrangement region is a first density, a pixel density of the transition region is a second density, a pixel density of the conventional region is a third density, and the first density and the second density are smaller than the third density; and
pixel circuits comprising first pixel circuits, second pixel circuits, and third pixel circuits, wherein the second pixel circuits are located in the transition region and electrically connected to the transition pixels, the third pixel circuits are located in the conventional region and electrically connected to the conventional pixels, and the first pixel circuits are electrically connected to the first pixels and at least some of the first pixel circuits are located in the transition region;
wherein a number of all the first pixel circuits is N, and a number of the at least some of the first pixel circuits located in the transition region is n, where $0.3 \leq n/N \leq 0.8$.

2. The display panel according to claim 1, wherein each of the transition pixels has a larger light-emitting area than the conventional pixels.

3. The display panel according to claim 1, wherein the first pixels comprise first edge pixels adjacent to the transition region, and at least some of the first pixel circuits electrically connected to the first edge pixels are located in the transition region.

4. The display panel according to claim 3, wherein,
the first pixels further comprise secondary edge pixels located at a side of the first edge pixels facing away from the transition region, and each of the secondary edge pixels is adjacent to one of the first edge pixels, and
at least some of the first pixel circuits electrically connected to the secondary edge pixels are located in the transition region.

5. The display panel according to claim 1, wherein,
each of the plurality of pixels comprises an anode, a light-emitting layer, and a cathode that are sequentially stacked;
the display panel further comprises first connection traces, and the at least some of the first pixel circuits located in the transition region are electrically connected to the anodes of the first pixels through the first connection traces; and
the display panel further comprises data lines located in a different layer from the first connection traces.

6. The display panel according to claim 1, wherein each of the first pixels has a smaller light-emitting area than the conventional pixels.

7. The display panel according to claim 1, wherein each of the first pixels has a same light-emitting area as the conventional pixels, and the pixel density of the optical module arrangement region gradually decreases in a direction from the conventional region towards the optical module arrangement region.

8. The display panel according to claim 1, wherein the pixel density of the transition region gradually decreases in a direction from the conventional region towards the optical module arrangement region.

9. The display panel according to claim 8, wherein light-emitting areas of the transition pixels gradually increase in the direction from the conventional region towards the optical module arrangement region.

10. A display device, comprising a display panel, the display panel having a display area comprising an optical module arrangement region, a transition region and a conventional region, the transition region surrounding at least a part of the optical module arrangement region, and the conventional region surrounding at least a part of the transition region, the display panel comprising:
a plurality of pixels provided in the display area and comprising first pixels located in the optical module arrangement region, transition pixels located in the transition region, and conventional pixels located in the conventional region, wherein a pixel density of the optical module arrangement region is a first density, a pixel density of the transition region is a second density, a pixel density of the conventional region is a third density, and the first density and the second density are both smaller than the third density; and
pixel circuits comprising first pixel circuits, second pixel circuits, and third pixel circuits,
wherein the second pixel circuits are located in the transition region and electrically connected to the transition pixels, the third pixel circuits are located in the conventional region and electrically connected to the conventional pixels, and the first pixel circuits are electrically connected to the first pixels and at least some of the first pixel circuits are located in the transition region,
wherein a number of all of the first pixel circuits is N, and a number of the at least some of the first pixel circuits located in the transition region is n, where $0.3 \leq n/N \leq 0.8$.

11. The display device according to claim 10, wherein, each of the plurality of pixels comprises an anode, a light-emitting layer, and a cathode that are sequentially stacked;

an area of the anode of each of the transition pixels is larger than an area of the anode of each of the conventional pixels; and in a direction perpendicular to a plane of the display panel, anodes of at least some of the transition pixels overlap a gap between traces of the first pixel circuits.

12. The display device according to claim 10, wherein the first pixels comprise first edge pixels adjacent to the transition region, and at least some of the first pixel circuits electrically connected to the first edge pixels are located in the transition region.

13. The display device according to claim 10, wherein, each of the plurality of pixels comprises an anode, a light-emitting layer and a cathode that are sequentially stacked;

the display panel further comprises first connection traces, and the at least some of the first pixel circuits located in the transition region are electrically connected to the anodes of the first pixels through the first connection traces; and the display panel further comprises data lines located in a different layer from the first connection traces.

14. The display device according to claim 10, wherein each of the first pixels has a smaller light-emitting area than the conventional pixels.

15. The display device according to claim 10, wherein each of the first pixels has a same light-emitting area as the conventional pixels, and the pixel density of the optical module arrangement region gradually decreases in a direction from the conventional region towards the optical module arrangement region.

16. The display device according to claim 10, wherein the pixel density of the transition region gradually decreases in a direction from the conventional region towards the optical module arrangement region.

17. The display device according to claim 16, wherein light-emitting areas of the transition pixels gradually increase in the direction from the conventional region towards the optical module arrangement region.

* * * * *